(12) United States Patent
Wiberg et al.

(10) Patent No.: US 8,509,204 B2
(45) Date of Patent: Aug. 13, 2013

(54) EFFICIENT ENCODING OF CONTROL SIGNALING FOR COMMUNICATION SYSTEMS WITH SCHEDULING AND LINK

(75) Inventors: Niclas Wiberg, Linköping (SE); Pål Frenger, Linköping (SE); Anders Furuskär, Stockholm (SE); Stefan Parkvall, Stockholm (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 1387 days.

(21) Appl. No.: 12/066,347

(22) PCT Filed: Sep. 9, 2005

(86) PCT No.: PCT/SE2005/001305
§ 371 (c)(1),
(2), (4) Date: Jul. 17, 2008

(87) PCT Pub. No.: WO2007/030041
PCT Pub. Date: Mar. 15, 2007

(65) Prior Publication Data
US 2009/0022133 A1      Jan. 22, 2009

(51) Int. Cl.
*H04B 7/216* (2006.01)

(52) U.S. Cl.
USPC ............................................. 370/342

(58) Field of Classification Search
USPC ............................................. 370/342
See application file for complete search history.

(56) References Cited

U.S. PATENT DOCUMENTS

| | | | | |
|---|---|---|---|---|
| 4,754,453 A | * | 6/1988 | Eizenhofer | 370/337 |
| 4,765,753 A | * | 8/1988 | Schmidt | 370/332 |
| 5,337,044 A | * | 8/1994 | Folger et al. | 340/7.1 |
| 6,044,339 A | | 3/2000 | Zack et al. | |
| 6,434,133 B1 | | 8/2002 | Hamalainen | |

(Continued)

FOREIGN PATENT DOCUMENTS

| | | |
|---|---|---|
| EP | 0 288 963 A2 | 11/1988 |
| EP | 0 624 034 A1 | 11/1994 |
| EP | 1 422 859 A2 | 5/2004 |
| TW | I224903 | 12/2004 |
| TW | I225374 | 12/2004 |
| WO | WO 01/33879 A1 | 5/2001 |
| WO | WO 01/39391 A2 | 5/2001 |

OTHER PUBLICATIONS

Ericsson. E-UTRA Uplink Radio Access. TSG-RAN WG1 AdHoc on LTE. R1-050620. Sophia Antipolis, France. Jun. 20-21, 2005.

(Continued)

*Primary Examiner* — Steven H Nguyen
*Assistant Examiner* — Saad A Waqas

(57) ABSTRACT

The invention relates to a method of sending control information from a first node to a second node in a communications system providing a plurality of resource units for the transmission of data. The control information is sent by use of a code book comprising at least one code word identifying control information relating to data transmission over a resource unit. The code book is dynamically updated by means of repeatedly transmitting an updated version of code book information from the first node to the second node. The invention also relates to a first communications node comprising means for transmitting control information to a second node. The means for transmitting control information is adapted to transmitting the control information by use of a code book; and to repeatedly transmitting an updated version of code book information in order to achieve that the code book is dynamic.

13 Claims, 10 Drawing Sheets

(56) References Cited

U.S. PATENT DOCUMENTS

| | | | |
|---|---|---|---|
| 6,717,990 B1 | 4/2004 | Abousleman | |
| 7,564,908 B2* | 7/2009 | Luz et al. | 375/260 |
| 7,746,758 B2* | 6/2010 | Stolpman | 370/203 |
| 7,937,111 B2* | 5/2011 | Ishii et al. | 455/561 |
| 2003/0123529 A1* | 7/2003 | Takano | 375/148 |
| 2004/0090993 A1* | 5/2004 | Sriram | 370/503 |
| 2004/0160923 A1* | 8/2004 | Nobukiyo et al. | 370/335 |
| 2006/0013185 A1* | 1/2006 | Seo et al. | 370/343 |
| 2006/0245384 A1* | 11/2006 | Talukdar et al. | 370/310 |
| 2011/0003589 A1* | 1/2011 | Hans et al. | 455/422.1 |

OTHER PUBLICATIONS

Lucent Signalling for H-ARQ Operation. 3GPP TSG-WG1 #31. R1-03-0285 Tokyo, Japan. Feb. 18-21, 2003.

Byeungwoo Jeon, et al. Huffman Coding of DCT Coefficients Using Dynamic Codeword Assignment and Adaptive Codebook Selection. Signal Process Image Communication 12 (1998). Nov. 15, 1995.

Ghosh, D et al. Fast Codeword Search Algorithm for Real-Time Codebook Generation in Adaptive VQ. , *Vision, Image and Signal Processing, IEE Proceedings*—, vol. 144, No. 5, pp. 278-284, Oct. 1997.

Schnell, M. Hadamard Codewords as Orthogonal Spreading Sequences in Synchronous DS CDMA Systems for Mobile Radio Channels. Spread Spectrum Techniques and Applications, 1994. IEEE ISSSTA '94., IEEE Third International Symposium on , vol., No., pp. 505-509 vol. 2, Jul. 4-6, 1994.

3$^{rd}$ Generation Partnership Project; Technical Specification Group Radio Access Network; Multiplexing and channel coding (FDD) (Release 5). 3GPP TS 25.212 v5.10.0 (Jun. 2005).

* cited by examiner

Fig. 4a

| code | session | time run length | frequency run length | modulation format |
|---|---|---|---|---|
| 000 | - | 1 | 1 | - |
| 001 | Lisa | 3 | 2 | QPSK |
| 010 | Lisa | 3 | 2 | 16-QAM |
| 011 | Lisa | 3 | 2 | 64-QAM |
| 100 | John | 1 | 2 | QPSK |
| 101 | John | 1 | 1 | 16-QAM |
| 110 | John | 1 | 1 | 64-QAM |

400i

407

| |
|---|
| 001 |
| 010 |
| 011 |
| 010 |
| 100 |
| 000 |
| 101 |
| 101 |
| 110 |

405i

| resource unit | session | modulation format |
|---|---|---|
| 0 | Lisa | QPSK |
| 1 | Lisa | QPSK |
| 2 | Lisa | 16-QAM |
| 3 | Lisa | 16-QAM |
| 4 | Lisa | 64-QAM |
| 5 | Lisa | 64-QAM |
| 6 | Lisa | 16-QAM |
| 7 | Lisa | 16-QAM |
| 8 | John | QPSK |
| 9 | - | - |
| 10 | John | 16-QAM |
| 11 | John | 16-QAM |
| 12 | John | 64-QAM |

420i

400ii

405ii

420ii

Fig. 5a
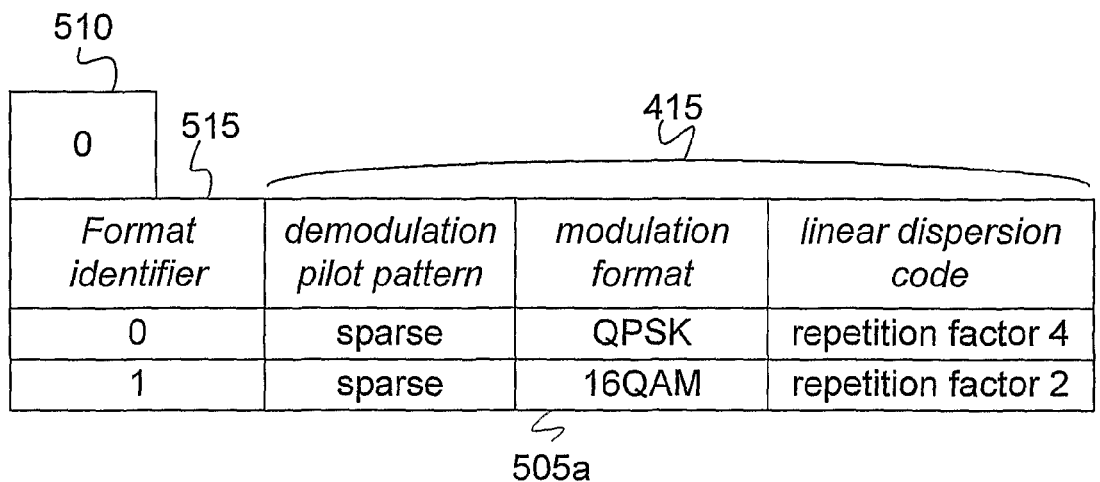
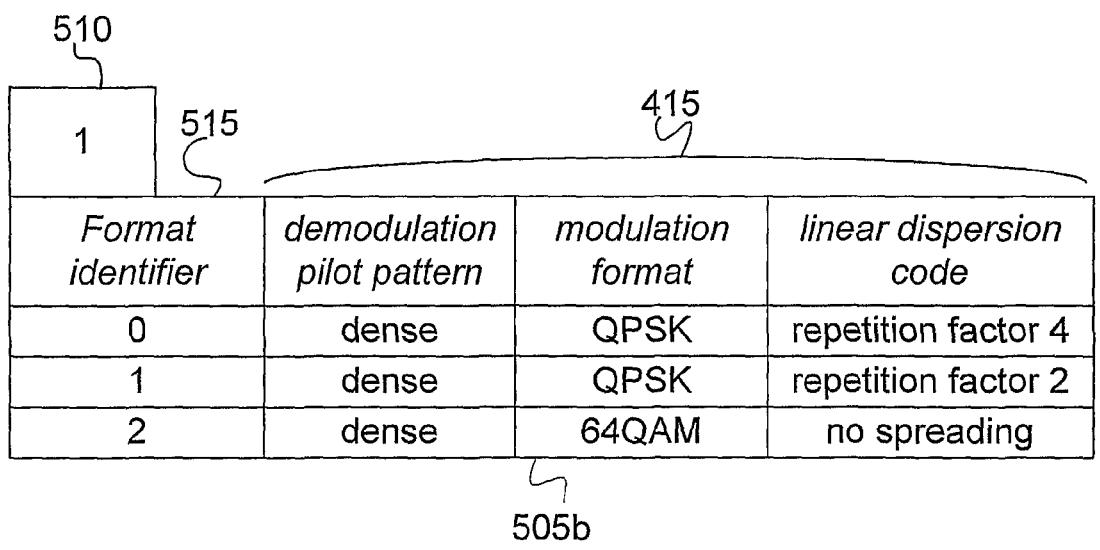
500

Fig. 5b

| | | |
|---|---|---|
| 530 | number of sessions | 3 |
| 535 | >session | Joe |
| 540 | >>transmission format family | 0 |
| 545 | >>> format 0 | false |
| | >>> format 1 | true |
| | >session | Mary |
| | >>transmission format family | 1 |
| | >>> format 0 | false |
| | >>> format 1 | true |
| | >>>format 2 | true |
| | >session | Andy |
| | >>transmission format family | 1 |
| | >>> format 0 | true |
| | >>> format 1 | true |
| | >>> format 2 | false |

| code | session | demodulation pilot pattern | modulation format | linear dispersion code |
|---|---|---|---|---|
| 0 | Joe | sparse | 16QAM | repetition factor 2 |
| 1 | Mary | dense | QPSK | repetition factor 2 |
| 2 | Mary | dense | 64QAM | no spreading |
| 3 | Andy | dense | QPSK | repetition factor 4 |
| 4 | Andy | dense | QPSK | repetition factor 2 |

| code | session | frequency run length | modulation format |
|---|---|---|---|
| 000 | - | 4 | - |
| 001 | - | 6 | |
| 010 | Lisa | 2 | 16-QAM |
| 011 | Lisa | 1 | 64-QAM |
| 100 | John | 4 | QPSK |
| 101 | John | 6 | 16-QAM |

400

| resource unit | 2nd unit indexing | session | LA format |
|---|---|---|---|
| 0 | - | Lisa | 16-QAM |
| 1 | - | Lisa | 16-QAM |
| 2 | 0 | John | QPSK |
| 3 | 1 | John | QPSK |
| 4 | 2 | John | QPSK |
| 5 | 3 | John | QPSK |
| 6 | 4 | John | 16-QAM |
| 7 | 5 | John | 16-QAM |
| 8 | - | Lisa | 64-QAM |
| 9 | 6 | John | 16-QAM |
| 10 | 7 | John | 16-QAM |
| 11 | 8 | John | 16-QAM |
| 12 | 9 | John | 16-QAM |

600

407

| 010 |
| 001 |
| 011 |
| 000 |

405a

407

| 100 |
| 101 |

405b

420

EFFICIENT ENCODING OF CONTROL SIGNALING FOR COMMUNICATION SYSTEMS WITH SCHEDULING AND LINK

FIELD OF THE INVENTION

The present invention relates to the field of data communication in general, and to the field of sending control information between two nodes in a communications network in particular.

BACKGROUND

Mobile radio communication services have become extremely popular over the last couple of decades. However, mobile radio resources are scarce, and there is a great need of using the available resources in an efficient manner.

One way of increasing the efficiency of the utilisation of the radio resources is to reduce the amount of control information that is signalled between the radio base station and the mobile stations. When the radio resources used for the transmission of control information is decreased, the amount of radio resources that is available for the transmission of payload is increased.

In the 3GPP Technical Specification 25.213, section 4.6.2.3, a method of allocating a number of spreading codes to a mobile station is disclosed. According to the specification, 15 different spreading codes are available for allocation to one or more mobile stations, each spreading code being identified by a consecutive number. The allocation of spreading codes to a mobile station is signalled to the mobile station by signalling the number identifying the first of the spreading codes that have been allocated to the mobile station, and the number of spreading codes that have been allocated. Hence, if the number of spreading codes allocated to the mobile station exceeds two, the amount of radio resources needed to signal the allocation will be lower than if a spreading code identification would have to be transmitted for each spreading code.

SUMMARY

A problem to which the present invention relates is how to increase the efficiency of the usage of transmission resources within a communications network.

This problem is addressed by a method of sending control information from a first node to a second node in a communications system providing a plurality of resource units for the transmission of data, wherein the control information is sent by use of a code book; the code book comprises at least one code word identifying control information relating to data transmission over a resource unit; and the code book is dynamically updated by means of repeatedly transmitting an updated version of code book information, by means of which the code book can be re-created, from the first node to the second node.

By using a code book for the transmission of control information is achieved that the control information can be efficiently compressed, since a code word, rather than the entire control information, can be transmitted. Although the entire control information is transmitted once per code word, the same code word can be used an unlimited number of times, and the total bandwidth used for the transmission of control information is hence reduced. By allowing for the code book to be dynamic is achieved that the control information can be adapted to varying radio conditions for the active sessions and/or a varying number of active sessions. Hence, advanced link adaptation can be performed, and an increased efficiency in the usage of bandwidth can be achieved.

In one aspect of the invention, the method comprises creating the code book; assigning a code word to at least one resource unit in a manner so that the control information identified by the assigned code word applies to the resource unit(s) to which the assigned code word is assigned; creating resource unit usage information comprising at least one assigned code word, the resource unit usage information being indicative of at least one resource unit to which the assigned code word has been assigned; sending the code book information to the second node; and sending the resource unit usage information to the second node. The code book is dynamically updated by means of repeatedly performing the steps of creating a code book and sending code book information.

By this aspect is achieved that resource unit usage information comprises information which links a particular resource unit to a code word being associated with control information which should be applied to the resource unit. In other words, the resource unit usage information comprises references to the code book. Each code word can be referred to in the resource unit usage information in relation to different resource units, and hence, the code book can provide fewer codes than the number of resource units. The code book information will only have to be sent to the second node when it has changed, and the resource unit usage information can be transmitted more frequently to indicate which code words should be applied to which resource unit.

The code book and/or the resource unit usage information could preferably comprise run length information indicating the number of resource units to which a code word has been assigned, so that the number of code words in the resource unit usage information may be smaller than the number of resource units to which a code word has been assigned.

Hereby is achieved that the amount of control information that needs to be transmitted from the first node to the second node is reduced.

The inventive method could advantageously be applied to a communications system in which a resource unit is part of a time frame. In such a system, the steps of creating a code book and sending code book information could advantageously be repeated for every $n^{th}$ time frame, where n could take the value 1, 2, 3 ... etc.

Hereby is achieved that the dynamics of the code book could have an appropriate time scale, and the receiver of the code book information could obtain predictability in when to receive an updated version of the code book information. The resource unit usage information could advantageously be updated every time frame.

The control information of the code book could for example relate to the identity of the session to which a resource unit should be allocated, and/or the transmission format that should be applied to a resource unit. In one embodiment of the invention, in which the code book information comprises a session identity field identifying a session to which at least two resource units should be allocated on which different transmission formats should be used, the session identity field is associated with the transmission format of the at least two resource units.

Hereby is achieved that the session identity will only have to be transmitted once per updating of the code book information. Since the session identity often comprises many bits, the usage of bandwidth can be reduced when the number of times the session identity is transmitted is reduced.

The control book information could comprises a reference to control information stored in a second node. Hereby is achieved that the amount of information that has to be transmitted over the interface between the first node and the second node is reduced.

The problem is also address by a first communications node for communicating with a second communications node in a communications system providing a plurality of resource units for the transmission of data. The first node comprising means for transmitting control information to the second node. The means for transmitting control information is adapted to transmitting the control information by use of a code book comprising at least one code identifying control information relating to data transmission over a resource unit. The means for transmitting is further adapted to repeatedly transmitting an updated version of code book information by means of which the code book can be re-created in order to achieve that the code book is dynamic.

In one embodiment of the invention, the first communications node is a radio base station, and the second communications node is a mobile station. The means for transmitting could in this embodiment advantageously be adapted to sending the code book information on a channel to which all mobile stations within the cell can listen simultaneously. Hereby is achieved that a resource unit that is used for signalling of control information can carry control information relating to several mobile stations in the cell, rather than using a resource unit per mobile station. In this way, the number of resource units used for the signalling of control information in the cell can be reduced.

In the embodiment where the first communications node is a radio base station, the radio base station could advantageously be arranged to receive quality measurements of the radio connection between the radio base station and the mobile station. The means for creating the code book could then be arranged to create the code book in accordance with the quality measurements in a manner so that the gain achieved by creating the code book is greater than the cost of transmitting the code book information and the resource unit usage information.

The problem is also addressed by a mobile radio communications system comprising the inventive radio base station, a computer program product comprising computer code operable to execute the inventive method, a method of receiving control information in the form of code book information and resource unit usage information, a computer program product comprising computer code operable to execute the method of receiving control information and a mobile station comprising the computer program product operable to execute the method of receiving control information.

BRIEF DESCRIPTION OF THE DRAWINGS

For a more complete understanding of the present invention, and the advantages thereof, reference is now made to the following descriptions taken in conjunction with the accompanying drawings, in which:

FIG. 4a shows a first instance of an example of a code book, resource unit usage information, and the allocation of resource units within a time frame resulting from applying the code book and the resource unit usage information to the time frame.

FIG. 5a shows an example of a set of transmission format families comprising a first and second transmission format family.

FIG. 5b shows an instance of code book information which can be used in conjunction with the set of transmission format families of FIG. 5b in order to recreate a code book.

FIG. 5c illustrates the instance of a code book which is recreated by use of the code book information of FIG. 5b and the set of transmission format families of FIG. 5a.

FIG. 6 shows an example of a first set of resource unit usage information and a second set of resource unit table associated with the same code book, and a table illustrating the allocation of resource units within a time frame resulting from the application of the sets of resource unit usage information.

DETAILED DESCRIPTION

Figure 1:
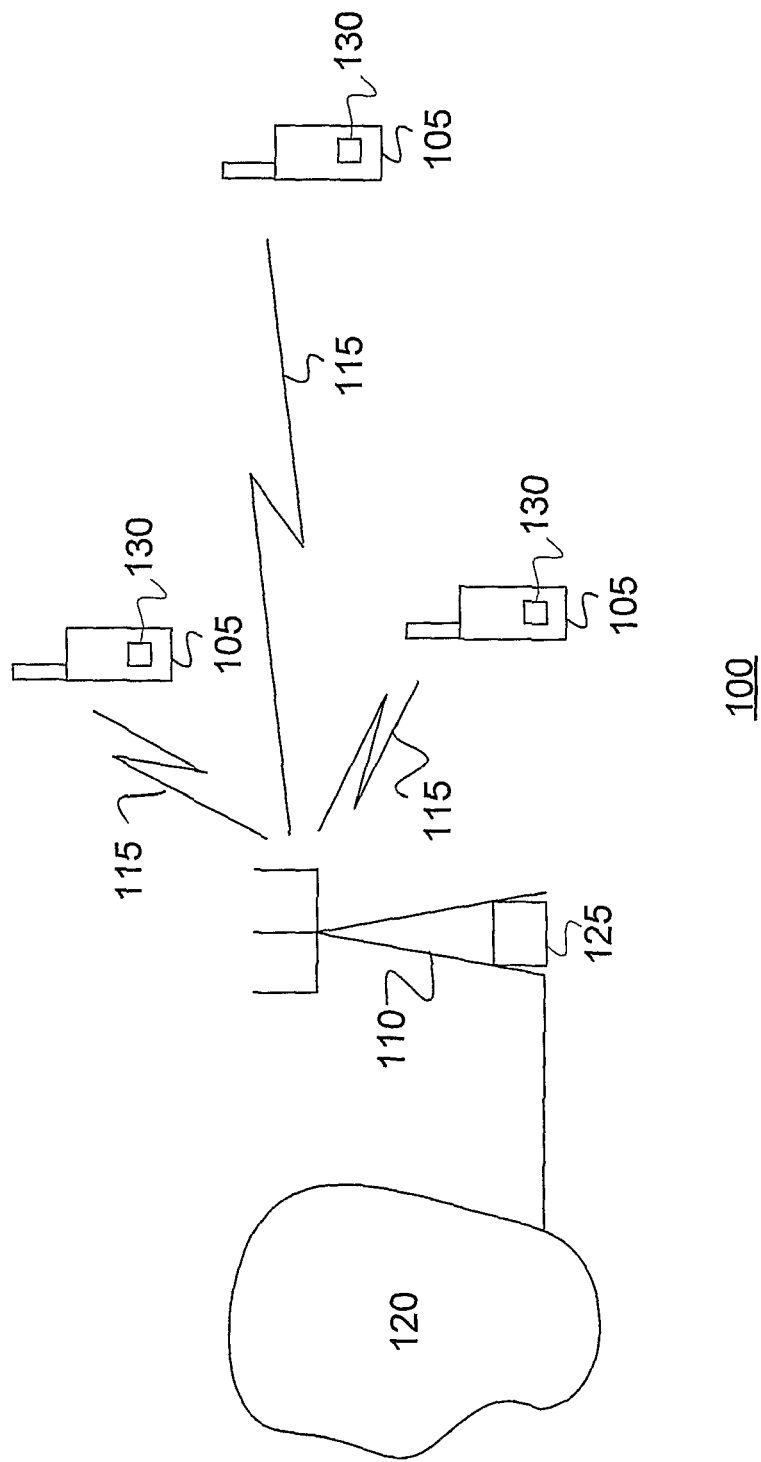
FIG. 1 is a schematic illustration of a mobile radio communications system.

FIG. 1 schematically illustrates a mobile radio communication system 100, in which mobile terminals 105 are shown to communicate with a radio base station 110 over radio links 115. The geographical area served by a radio base station is referred to as a cell. Radio base station 110 is further connected to a core network 120, which in turn is connected to other radio base stations, not shown, as well as to other communications systems. Mobile radio communications system 100 will in the following be referred to as system 100.

The radio quality of a radio link 115 varies over time, due for example to variations in the distance between the mobile terminals 10S and the radio base station 110, changes in the radio environment caused for example by moving cars, etc. In order to efficiently use the available radio resources, the variations in the radio link quality can preferably be accounted for when determining the properties of the radio transmission on the radio link, such as the modulation scheme and channel coding parameters. The quality of the radio link could preferably be monitored, and the properties of the radio transmission adapted accordingly. This is referred to as link adaptation.

A radio link 115 can typically be used for voice calls, as well as for data transfer sessions. In the following, calls, as well as data transfer sessions, will be referred to as sessions. Different sessions upheld by radio base station 110 could involve communication between the same mobile station 105 and the radio base station 110, or between different mobile stations 105 and the radio base station 110.

In a system 100 where the amount of radio resources allocated to a particular session can vary over time, the allocation of radio resources to different sessions can preferably be based on, inter alia, the quality of the different radio links 115 used by different active mobile terminals 105, in a manner so that the amount of resources allocated to a particular session is larger when the quality of the radio link 115 is higher, and smaller when the quality of the radio link 115 is lower. In many situations, it is advantageous to let a user operating on a radio link of high quality use more of the available resources than a user operating on a radio link of lower quality. Furthermore, the instant quality of a radio link 115 may vary with the frequency of transmission, and hence, the frequencies used for the transmission of a particular session could in some instances advantageously be altered during the session. The determining of which radio resources are to be used by which sessions is often referred to as scheduling. The scheduling of the resources that are being used by a session is often performed several times during the duration of the session, and could typically be updated on a time scale of milliseconds.

Figure 2:
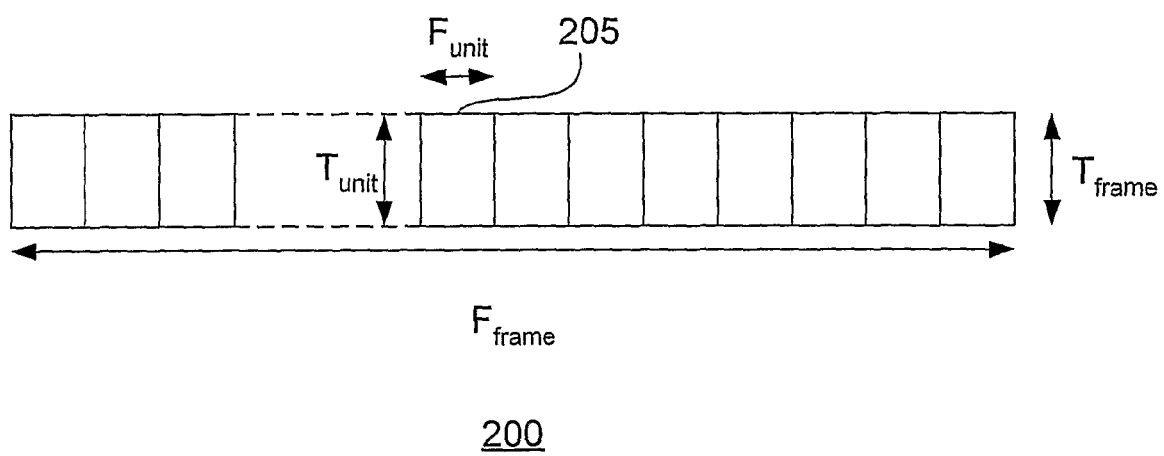
FIG. 2 illustrates a time frame of a radio link, wherein the time frame is divided into several resource units in the frequency domain.

In the following, the radio resources available for communication between a radio base station 110 and mobile terminals 105 will be considered to consist of a plurality of radio resource units. A radio resource unit is the smallest unit that can be allocated to a session, and the largest unit within which the link adaptation parameters have to be constant. In FIG. 2, the concept of resource units is illustrated, where a Frequency Division Multiple Access system (FDMA) is used as an example. A frame 200 of a radio link 115 is illustrated to have a time duration $T_{frame}$ and a frequency span $F_{frame}$. The frame 200 of FIG. 2 is illustrated to consist of a plurality of radio resource units 205, each having a time duration $T_{unit}=T_{frame}$ and a frequency span $F_{unit}=F_{frame}/N$, where N is the number of radio resource units 205 of time frame 200 of FIG. 2. However, a frame 200 could be divided into radio resource units 205 in any manner. The example provided by FIG. 2 is an example of how a frame 200 in a system 100 based frequency division multiple access could be divided into radio resource units 205. In a system 100 based on other ways of providing multiple access, a radio resource unit 205 could be defined by other quantities. In a system 100 based on code division multiple access, for example, a radio resource unit 205 could be defined by the quantities time and code. In the following, for purposes of illustration only, the invention will be described in terms of a system 100 operating according to frequency division multiple access.

In order to optimise the usage of the available radio resources, the link adaptation and/or the scheduling should preferably be made on a dynamic basis, and the more often the link adaptation and/or the scheduling are updated, the better the scheduling of resources and the link adaptation of the radio channel can be adapted to the instant quality of the radio link. Similarly, the more granular the allocation of radio resources is in the frequency domain, the better the scheduling of resources and the link adaptation can be adapted to the quality of the radio links. However, the result of any scheduling, as well as any link adaptation, will have to be communicated to the mobile terminals 105 concerned, in order for the mobile terminals 105 to know which radio resource units 105 to listen to, and in order to know how to interpret the transmitted data. Hence, if the link adaptation and/or the scheduling is performed to a high granularity in the time and/or frequency domain, the efficiency gained by adapting the link and the resource allocation to the quality of the radio links may be lost due to the increased signalling load in the system 100. Hence, in order to keep the signalling load low, there is a need for an efficient way of signalling control information, such as transmission format information and scheduling information, to mobile terminals 105.

According to the invention, the signalling of control information is based on the usage of a code book and resource unit usage information. The code book comprises code words, where a code word identifies control information that could be applied to a radio resource unit 205. The code words are used as indices to the code book. The resource unit usage information defines which code word applies to different resource units. The resource unit usage information could advantageously be a table of code words, and the order in which the code words appear in the table can preferably be indicative of to which radio resource units each code word in the table relates. The reading of the code words of the table, and the checking the code book for the interpretation of the code words, result in information on the usage of a set of radio resource units 205.

The control information signalled by means of the code book could for example be scheduling information and/or information on transmission format, such as modulation scheme and channel coding parameters for a session. The code book and resource unit usage information could advantageously comprise control information relating to several mobile stations 105 in the cell, and be transmitted from the radio base station 110 on a control channel to which all the mobile stations 105 in the cell listen. Hence, a resource unit 205 that is used for signalling of control information can carry control information relating to several mobile stations 105 in the cell, rather than using a resource unit 205 per mobile station 105. In this way, the number of resource units 205 used for the signalling of control information in the cell can be reduced. A message carrying the code book information (by means of which the code book can be re-created) and/or resource unit usage information would not have to include any identification of an intended receiver of the message when the message is transmitted on a control channel to which all mobile stations in the cell listen.

As discussed above, it would be advantageous to allow for a dynamic scheduling and a fast adaptation of the transmission format, if only the signalling of the changes in scheduling and transmission format would not outweigh the gain of the changes. Hence, to allow for the code book to be dynamic would increase the efficiency of the utilisation of the radio resources within a cell. A new version of the code book could be created for every time frame 200, or at a slower rate. Since both the radio base station 110 and the mobile stations 105 need to have the same version of the code book, the code book (or information by which the code book can be derived) would have to be signalled from the radio base station 110 to the other mobile stations 105 each time the code book is updated in the case when the radio base station 110 creates the code book. When the responsibility for the code book creation rests with the mobile stations 105, the code book would similarly have to be signalled from the mobile stations 105 to the radio base station 110.

The code book and/or the resource unit usage information can preferably include information on the run length of a code word, i.e. information on for how many radio resource units 205 the code word applies. The run length can be defined for each domain that is used to define a resource unit 205, such as e.g. time and frequency, or time and code. By using the same code word for several resource units 205 and providing run length information in relation to a code word, rather than sending the control information or the code word several times, the signalling load can be greatly reduced. The run length information could either be included in the code book or the resource unit usage information. Furthermore, one part of the run length information could be included in the code book, and another part could be included in the resource unit usage information. For example, in a system 100 where the resource units 205 are defined in the time and frequency domain, the time run length information could be included in the code book, and the frequency run length could be included in the resource unit usage information.

Figure 3:
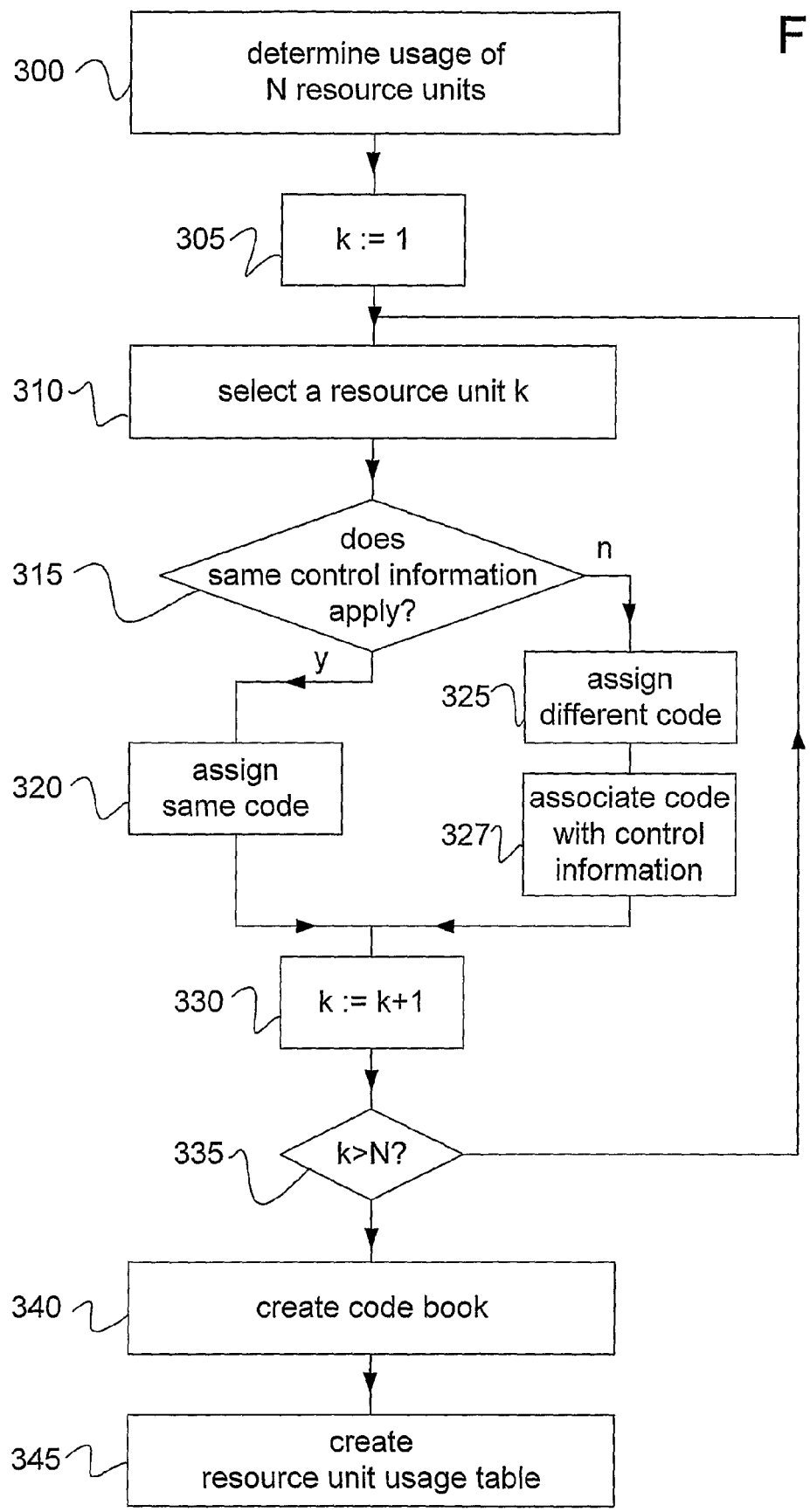
FIG. 3 is a flowchart of an example of a method for generating a code book and resource unit usage information.

A method of generating a code book and resource unit usage information is illustrated in FIG. 3. In step 300, the usage of N different resource units 205 is determined, and the control information that applies to the N different resource units 205 is identified. The N different resource units 205 could be part of the same time frame 200, or of different time frames 200. The control information could for example include information on the session to which the resource unit 205 has been allocated, the transmission format to be used for any transmission over the resource unit, etc.

In step 305, a counter k is set to 1. In step 310, a resource unit k is selected out of the N resource units 205. In step 315, the control information that is relevant to resource unit k is identified, and the control information is compared to the control information that is relevant to the resource units 205 which have previously been selected in step 310. If the control information of any of the previously selected resource units 205 is the same as the control information of resource unit k, step 320 is entered, in which a code word is assigned to resource unit k, the code word being the same code word as the code word which has been assigned to the resource unit 205 to which the same control information applies. Step 330 is then entered. If the control information of none of the previously selected resource units 205 is relevant to resource unit k, then step 325 is entered, in which a code word, which has previously not been assigned to any resource unit 205, is assigned to resource unit k. Step 327 is then entered, in which the control information relevant to resource unit k is also associated with the code word assigned to resource unit k in step 325. Step 330 is then entered. Hence, in step 320 and 325, a code word is assigned to the resource unit k in accordance with the control information demands on the resource unit k.

In step 330, the counter is increased by one, and in step 335, it is checked whether the counter is larger than N. If not, step 310 is re-entered and the next resource unit 205 is selected. When all N resource units 205 have been selected, step 340 is entered, in which a code book is created by entering in the code book all different code words that have been assigned in step 325, and the control information associated with the code words. In step 345, resource unit usage information is created, comprising the code words assigned to the resource units 205 in steps 320 or 325, in a manner so that the usage of a particular resource unit 205 can be derived. This could advantageously be achieved by letting the order of appearance of the code words in the resource unit usage information signify the particular resource units 205 to which the code words apply. Alternatively, an identity of the resource unit 205 to which a code word applies could be included in the resource unit usage information. When the same code word applies to several resource units 205, the steps 340 and/or 345 could preferably include including run length information in the code book and/or the resource unit usage information, so that the number of code words in the resource unit usage information may be smaller than N.

The method of creating a code book and resource unit usage information could be altered in many ways. In particular, the code book could be created without knowledge of any allocated usage of resource units 205, and the step 340 could be performed prior to step 300. In this case, steps 305-335 could be replaced by assigning a code word from the code book to each of the N resource units 205 in accordance with the control information demands on the resource units 205.

Figure 4B:
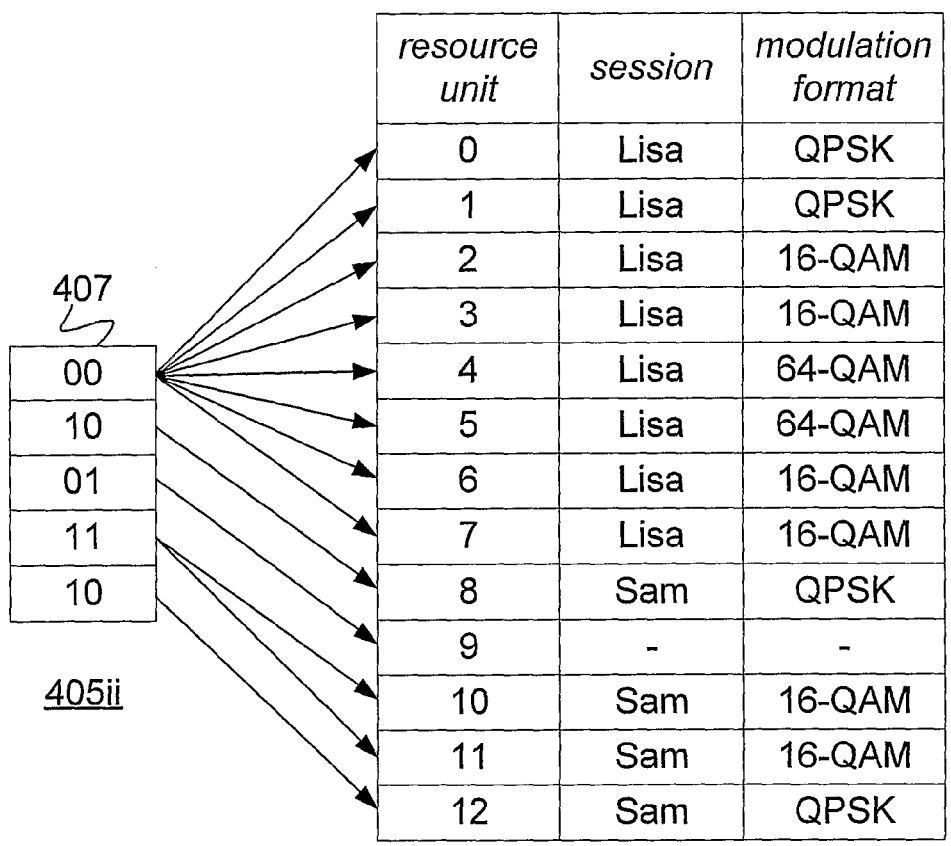
FIG. 4b shows a second instance of the code book and resource unit usages tables of FIG. 4b, as well as the allocation of resource units within the time frame immediately following the time frame of FIG. 4a by applying the second instance of the code book and resource units.

An example of a code book 400 and resource unit usage information 405 are illustrated in FIG. 4. The example in FIG. 4 applies to a resource unit format where a time frame 200 consists of 12 resource units 205 of different frequency, where $T_{unit}=T_{frame}$. The code book 400$i$ of FIG. 4$a$ comprises 7 different code word fields 410, each storing a unique code word and being associated with a session identity field 412 and a set 415 of transmission format information fields (the set 415 of the example comprising only one transmission format information field), as well as with a set 417 of run length fields. The session identity field 412 comprises information on the session to which a resource unit 205, to which the code word in the code book field 410 applies, has been allocated. The set 415 of transmission format information fields of FIG. 4$a$ comprises information on the modulation format that should be used on a resource unit 205 to which the code word applies. The set 417 of run length fields of code book 400$i$ comprises information on time run length and frequency run length of the code word in the code word field 410. The time run length determines the duration of the code word stored in the code word field 410 in the time domain, whereas the frequency run length determines the duration of the same code word in the frequency domain. For example, the code word "001" of FIG. 4$a$ has an associated time run length 4 and an associated frequency run length 2. The associated session identity is "Lisa" and the associated modulation format is "QPSK". Hence, a reference to the code word "001" in the resource unit usage information 405$i$ would result in the allocation of two consecutive radio resource units 205 of a time frame 200 to the session "Lisa" using the modulation format "QPSK", for three consecutive time frames 200. The resource unit usage information 405$i$, comprising a number of code word fields 407 comprising code words referring to the code book 400$i$, is also illustrated in FIG. 4$a$. A table 420$i$ illustrating the usage of the radio resource units 205 in a first time frame 200$i$, resulting from the combination of resource unit usage information 405$i$ and code book 400$i$, is also shown in FIG. 4$a$.

The combination of resource unit usage information 405$i$ and code book 400$i$ in order to determine the usage of resource units 205 also results in the allocation of resource units 205 which are part of the two following time frames 200, since some values of the run time length of code book 400$i$ are larger than 1. This is not shown in table 420$i$ of FIG. 4$a$, since table 420$i$ only illustrates the usage of resource units 205 which are part of the time frame 200$i$. However, in FIG. 4$b$, the usage of the radio resource units 205 of the next time frame 200$ii$ is illustrated.

FIG. 4$b$ illustrates a second code book 400$ii$ applicable to the next time frame 200$ii$. Code book 400$i$ and 400$ii$ could be seen as two different instances of the same code book 400. A corresponding resource unit usage information 405$ii$ is also shown, as well as a table 420$i$ illustrating the resulting usage of radio resource units 205 of the next time frame 200$ii$. The eight first radio resource units 205 of time frame 200$ii$ have already been allocated by the combination of code book 400$i$ and resource unit usage information 405$i$, as illustrated in FIG. 4$a$. In order to indicate this to a user (e.g. a mobile terminal 105) of the code book 400$ii$ and the resource unit usage information 405$ii$, a code word "00", representing a frequency run length of 8 to which no session identity is associated, is included in the code book 400$ii$ and referred to in the first entry of resource unit usage information 405$ii$. Hence, the combination of the code book 400$ii$ and the resource unit usage information 405$ii$ reveals that the eight first resource units 205$i$ of time frame 200$ii$ should not be allocated to a new session.

The code book instance 400$ii$ contains fewer code words than the code book instance 400$i$, and the code words of code book instance 400$ii$ can therefore be represented by fewer bits, as is shown in FIG. 4$b$. In allowing the number of bits used for the representation of code words of a code book 400 to vary between instances, the signalling load on the radio links 115 can be reduced. However, the code words of a code book 400 could alternatively be represented by a fixed number of bits in all instances of the code book 400.

The information on session identity in session identity field 412 could in some cases refer to more than one session. In downlink scheduling, this can applied to e.g. multicast or broadcast channels, where the data to be transmitted in the different sessions are the same, and therefore the requirements of the transmission may be similar. In uplink scheduling, the identification of more than one session by use of a single session identity can be used to realize contention-based channels, where several users contend for the same uplink resource unit 205, as is the case in e.g. ALOHA-based transmission.

In the example given in FIG. 4, the set 415 of transmission format information fields comprises information on modulation format. A set 415 of transmission format information fields could comprise any information related to the transmission format of a session, such as demodulation pilot pattern, linear dispersion code, size of transport block, number of code bits, redundancy version, number of virtual antennas, etc.

The invention could be applied both to SISO (Single Input Singe Output) systems and MIMO (Multiple Input Multiple Output) systems. In a MIMO system, where different antennas of a first node transmit different information to a second node by use of the same resource unit 205, the different antennas are said to transmit on different layers of the resource units 205. A different code book 400 and resource unit usage information 405 could be used for the different layers, or each layer could apply the same code book 400 and resource unit usage information 405.

In a simple form, a code book 400 would comprise a number (at least one) of code word fields 410, and a to the code word fields 410 associated session identity field 412 comprising information on the session to which a radio resource unit 205 to which the code word relates should be allocated, and no transmission format fields 415. In yet another embodiment, the code book 400 does not comprise any session identity fields 412, but merely code word fields 410 and associated transmission format fields 415. This could for example be the case when a code book 400 is signalled from a mobile station 105 to a radio base station 110, and the identity of the mobile station 105 is already known by the radio base station 110.

In situations when all the code words in the resource unit usage information 405 are different, the resource unit usage information 405 does not have to be explicitly signalled. Instead, the resource unit usage information 405 could be implicitly disclosed as the order of appearance of the code words in the code book 400.

According to the invention, the radio base station 110 and a mobile terminal 105 with which the radio base station 110 is communicating should have access to the same code book 400 and the same resource unit usage information 405. Hence, if the code book 400 and the resource unit usage information 405 are created by the radio base station 110 (or another node in system 100), information by which the code book 400 and the resource unit usage information 405 can be re-created should be signalled to the mobile terminals 105 concerned, and vice versa. Information by which the code book 400 can be recreated will in the following be referred to as code book information. The code book information and resource unit usage information are preferably signalled via one or more radio resource units 205 that are dedicated to signalling, and the code book information and the resource unit usage information could be transmitted in one or more messages. The code book information and the resource unit usage information could be transmitted in the same message, in different messages transmitted by means of the same transmission protocol, or in different messages transmitted by means of different transmission protocols.

In some cases, a code book 400 may be valid for a longer period of time than the resource unit usage information 405. In such cases, a new instance of the resource unit usage information could be transmitted more often than the code book information. In one implementation of the invention, a new instance of the code book information is transmitted at regular time intervals which are larger than regular time interval at which the resource unit usage information is transmitted. In another implementation of the invention, a receiver of resource unit usage information that is not accompanied by any code book information will assume that the last received code book information is still valid.

In other cases, the previously transmitted code book 400 may be partially re-used, so that only parts of the new instance of the code book 400 has to be transmitted. The message(s) transmitting the new instance of the code book 400 could then comprise a reference to parts of the previous instance of the code book 400 that are still relevant.

The signalling of the code book 400 could be performed in different ways. In one embodiment of the invention, the code book 400 is transmitted in full, so that the code book information comprises all the information in the code book 400 to be transmitted. In another embodiment of the invention, some parts of the code book information are static, and will hence not change between different instances of the code book 400. These static parts of the code book 400 will not have to be included in the code book information each time a new instance of the code book 400 is signalled. Similarly, some parts of the resource unit usage information may be static (or semi-static, so that they change at a slower rate than the rate by which new instances of the resource unit usage information are transmitted) so that these static or semi-static parts will not have to be transmitted each time the resource unit usage information 405 is updated. Such static or semi-static parts of the resource unit usage information could for example relate to how to link the code words in the resource unit usage information to resource units 205.

In one embodiment of the invention, different values of the set 415 of transmission format information fields are stored in a storage in the radio base station 110 (or in another node on the network side of system 110) as well as in a storage in mobile terminals 105. In these storages, each value of the set 415 of transmission format information fields is associated with an identifier, which in the following will be referred to as a format identifier. In FIG. 5a, an example of a set 500 of transmission format families is illustrated by means of tables illustrating the transmission format families 505 in the set 500. The set 500 of transmission format families of FIG. 5a comprises a first transmission format family 505a comprising two different values of a set 415 of transmission information fields, and a second transmission format family 505b comprising three different values of the set 415 of transmission format information fields. Each value of the set 415 of transmission format information fields in families 505a and 505b is associated with a format identifier field 515, comprising information on a format identifier identifying the value. Furthermore, each of the two transmission format families 505a and 505b comprises a family identifier field 510, identifying the format family. A set 500 of transmission format families could contain any number of transmission format families 505, including only one, and a transmission format family 505 could comprise any number of values of the set 415 of transmission format information fields.

In this embodiment, the value of the format identifier field 515 can be transmitted from the base station 110 to a mobile terminal 105, or vice versa, when referring to the value of a set 415 of transmission format information fields, rather than transmitting the value of the set 415 of transmission format information fields. Hence, when the value of the format identifier 515 is represented by fewer bits than the value of the set 415 of transmission information, the signalling load in system 100 can be reduced.

In one aspect of this embodiment, the signalling load can be reduced even further by grouping together, in the message(s) by which the code book information is transmitted, the values of the set 415 of transmission format information fields 415 that are allocated to the same session. Since the session identifier is often represented by a large number of bits, the signalling load can be reduced by transmitting a session identifier only once per code book information transmission. In FIG. 5b, a table 520 is shown, which illustrates an instance of the code book information that can be used in this aspect of the example of FIG. 5a. The code book information of FIG. 5b comprises a number-of-sessions field 530 comprising information on the number of sessions that are being scheduled by means of the instance of the code book information, and for each of these sessions: a session identity field 535 comprising information on the identity of the session being scheduled, a transmission format family field 540 comprising information referring to the family identifier field 510 of a transmission format family(ies) 505 that should be used by this session, and, for each value of the set 415 in the transmission format family 505, a format usage information field 545 comprising information on whether or not this particular value is being used by the session identified in the session identity field 535. In implementations of this embodiment in which the set 500 of format families contains only one format family 505, the transmission format family field 540 could be omitted.

FIG. 5c illustrates the code book 400 obtained by the code book information of table 520 of FIG. 5b in conjunction with the transmission format families 505 of FIG. 5a. The code book 400 of FIG. 5c comprises five different code words, each associated with a session identity field 412 and a set 415 of transmission format information fields, wherein each set 415 of transmission format information fields of code book 400 has been retrieved from a storage storing the set 500 of transmission format families. The code words assigned to a combination of set 412 and set 415 can be implicitly derived from the code book information: in the example given in FIGS. 5b and 5c, the order of appearance of the session identifiers and format identifiers in the code book information 520 is used to determine the code word.

Figure 5D:
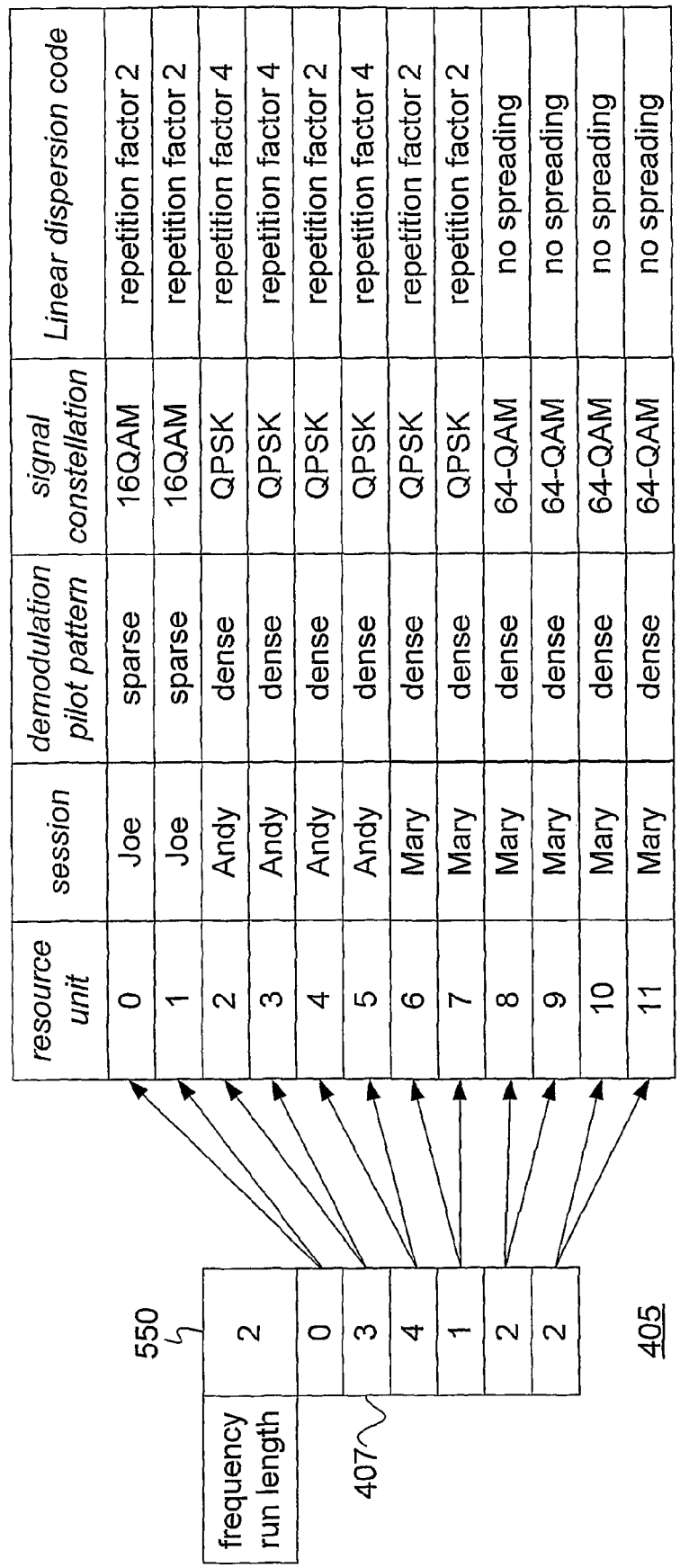
FIG. 5d shows an instance of resource unit usage information associated with the code book of FIG. 5c, as well as a table illustrating the allocation of resource units within a time frame resulting from the application of the resource unit usage information.

The code book 400 of FIG. 5c does not comprise any set of run length fields 417. As will be shown in FIG. 5d, run length information can be included in resource unit usage information 405 associated with the code book 400. Alternatively, code book 400 of FIG. 5c could include such information (cf. FIG. 4).

In FIG. 5d, an instance of an example of resource unit usage information 405 is shown. The resource unit usage information 405 comprises a number of code word fields 407, each comprising a reference to a code word in the code book 400 of FIG. 5c. Resource unit usage information 405 of FIG. 5d furthermore comprises a set 550 of run length fields 550, which comprises frequency run length information indicating to how many consecutive resource units 205, in a time frame 200, a code word in a code word field 407 applies. In the example given in FIG. 5d, the number of resource units 205 to which each code word applies is set to 2. A table 420 illustrating the usage of the radio resource units 205 in a time frame 200 resulting from the combination of resource unit usage information 405 and code book 400 of FIGS. 5d and 5c, respectively, is also shown in FIG. 5d.

The set 550 of run length fields of FIG. 5d only comprises a frequency run length field. However, a time run length field could also, or alternatively, be included. Moreover, each code word field 407 could be associated with a set of run length fields 550, so that the run length information can vary between every code word.

In a situation where the frequency run length and the time run length of a resource unit do not vary over time, no run length field 550, nor a time run length field, is necessary, neither in the code book 400, nor in the resource unit usage information 405.

In the examples given above, the allocation of several resource units 205 by use of a single code word were done in a consecutive fashion. Since channel quality often does not vary significantly over the time and frequency span occupied by a single resource unit 205, this consecutive allocation of resource units is often appropriate. However, there may be times when a greater flexibility of the allocation is desired.

The flexibility of the allocation of resource units 205 to different sessions can be increased by using more than one set of resource unit usage information 405 when performing an update of the allocation of resources. This is illustrated in FIG. 6, in which a code book 400 is illustrated, together with a first set of resource unit usage information 405a, and a second set of resource unit usage information 405b, both associated with the code book 400. A table 420 illustrating the usage of the radio resource units 205 in a time frame 200 resulting from first combining the code book 400 with the first set of resource unit usage information 405a, and then with the second set of resource unit usage information 405b. The allocation of resource units is performed sequentially according to the order of appearance of the different code words in the sets of resource unit usage information 405, but when using the second resource unit usage information 405b, only the resource units 205 that are still not allocated to a session are considered. This can be seen as if the resource units 205 in a time frame 200 is re-indexed for each resource unit usage information 405, where the new indexing does not include the resource units 205 that have already been assigned to a session, as is illustrated by column 600 of table 420. The use of more than one resource unit usage information 405 facilitates for the allocation of non-consecutive resource units 205 to the same session by use of the same code word.

The allocation of non-consecutive resource units 205 to the same session by use of the same code word can for example be desirable in order to achieve diversity when channel quality indicators are unreliable or missing. In such cases, a periodic allocation is suitable, where every nth resource unit 205 within a group of resource units are allocated to the same session. In order to simplify the periodic allocation of resource units, the set 417 of run length fields could include a frequency and/or time period indicator n, indicating that every nth resource unit within a frequency run length and/or a time run length should be allocated to a session to which the associated code word applies. In an alternative implementation of periodic allocation to a session by use of a single code word, certain values of a frequency and/or time run length field can be predefined to represent certain periodic allocation patterns. Predefined values of the frequency or time run length field could furthermore represent non-periodic, predefined, allocations of resource units 205 in the frequency or time domain, respectively. The receiving node can switch off its receiver in between the allocated resource units 205.

In one aspect of the invention, super code word can be defined, referring to underlying code words. A super code word "011" could for example represent the L times repeated concatenation of the code words 001 and 010. The occurrence of the super code word "011" in the resource unit usage information 405 would then result in that the code words "001" and "010" are repeated L times.

In another aspect of the invention, the code words in the code word fields 407 of the resource unit usage information 405 are repeated if the allocation of radio resources according to the code words does not result in the allocation of all resource units 205 in a time frame 200. A flag could be used to indicate that the code words in code word fields 407 should be repeated, or the repetition of code words could be performed by default. The repetition of code words can result in a great reduction in signalling.

According to the invention, the system 100 comprises a generation apparatus for generating the code book 400 and resource unit usage information 405 based on, inter alia, radio link quality measurements performed by the radio base station 110 and/or the mobile terminals 105. The generation apparatus is preferably implemented in the radio base stations 110 of system 100, but could alternatively be implemented in a base station controller, or similar node, or elsewhere in the system 100. The radio base station 110 further comprises transmission means for transmitting the code book information and the resource unit usage information 405 to the mobile station 105. The transmission means if preferably adapted to transmitting the code book information and the resource unit usage information on a control channel to which all the mobile stations 105 in the cell can listen simultaneously. A generation apparatus could also be implemented in mobile stations 105. The generation apparatus could advantageously be implemented, in part or in full, as software. The radio base station 110 of FIG. 1 is shown to include a generation apparatus 125.

For practical purposes, it may be beneficial to limit the size of the code book 400 and resource unit usage information(s) 405. The generation apparatus could advantageously be arranged to ensure that the size of the generated code book 400 and resource unit usage information 405 does not exceed a maximum size, by selecting a usage of resources that yield a code book 400 and corresponding resource unit usage information 405 that do not cause the maximum size to be exceeded.

Similarly, it would be advantageous for the generation apparatus to be adapted to assess the expected gain from the flexible resource usage obtained from using a particular code book 400. Estimations of the expected gain can be obtained from quality measurements. The expected gain can then be compared to the drawback of the signalling load caused by the signalling of the code book 400, so that a suitable code book format can be chosen for which the expected gain justifies the increased signalling load caused by the transmission of the code book 400 and resource unit usage information 405.

Furthermore, a node that will be receiving the resource unit usage information 405 and the code book 400, or code book information by which the code book 400 may be re-created, comprises an interpretation apparatus for interpreting code book information and resource unit usage information 405 received from the generation apparatus. The mobile terminals 105 of FIG. 1 are shown to include an interpretation apparatus 130.

As can be seen from the above, the information that needs to be signalled within a system 100 can be greatly reduced if the code book 400 and the code book information 500 are generated in an efficient manner.

The invention could advantageously be applied to a system using orthogonal frequency division access (OFDM), in which the number of resource units 205 allocated to a session is dynamic. The invention is also applicable to Time Division Multiple Access (TDMA) systems, as well as in Code Division Multiple Access (CDMA) systems.

In the above, the invention has been described in terms of a mobile radio communications system 100, in which the resource units 205 are radio resource units. However, the invention can also be applied to any system in which the number of resource units 205 that can be allocated to a session can vary, and/or in which the transmission format of a session can vary. An example of such a system is an Asynchronous Digital Subscriber Line (ADSL) system, in which the resource units are resource units of a wired connection, and the code book information and resource unit usage information 405 are transmitted between the two ADSL modems.

One skilled in the art will appreciate that the present invention is not limited to the embodiments disclosed in the accompanying drawings and the foregoing detailed description, which are presented for purposes of illustration only, but it can be implemented in a number of different ways, and it is defined by the following claims.

The invention claimed is:

1. A method of sending control information from a first node to a second node in a communications system providing a plurality of resource units for the transmission of data, the method comprising the steps of:
using a code book to send the control information; the code book comprises at least one code word identifying control information relating to data transmission over a resource unit; and the code book is dynamically updated by means of repeatedly transmitting an updated version of code book information from the first node to the second node;
creating the code book; assigning a code word to at least one resource unit in a manner so that the control information identified by the assigned code word applies to the resource unit to which the assigned code word is assigned; creating resource unit usage information comprising at least one assigned code word, the resource unit usage information being indicative of at least one resource unit to which the assigned code word has been assigned; wherein an order of appearance of the assigned code word with respect to other assigned code words in the resource unit usage information signifies the at least one resource unit to which the assigned code word applies; sending the code book information to the second node; and sending the resource unit usage information to the second node; wherein the code book is dynamically updated by means of repeatedly performing the steps of creating a code book and sending code book information; and
wherein the control information applicable to a resource unit comprises an identity of a session to which a resource unit should be allocated and a transmission format to be applied to the resource unit, and the code book information comprises a session identity field identifying a session to which at least two resource units should be allocated on which different transmission formats should be used, and wherein the session identity field is associated with the transmission format of the at least two resource units.

2. The method of claim 1, wherein the code book and/or the resource unit usage information comprises run length information indicating the number of resource units to which a code word has been assigned, so that the number of code words in the resource unit usage information may be smaller than the number of resource units to which a code word has been assigned.

3. The method of claim 1, wherein a resource unit is part of a time frame, and the steps of creating a code book and sending code book information is repeated for every n"<1> time frame.

4. The method of claim 1, wherein the control information comprises an identity of a session to which a resource unit should be allocated.

5. The method of claim 1, wherein the control information comprises a transmission format to be applied to a resource unit.

6. The method of claim 1, wherein the code book information comprises a reference to control information stored in the second node.

7. A computer program product comprising computer code operable to execute a method of sending control information from a first node to a second node in a communications system providing a plurality of resource units for the transmission of data when run on a computer, where the method comprising the steps of:
  using a code book to send the control information; the code book comprises at least one code word identifying control information relating to data transmission over a resource unit; and the code book is dynamically updated by means of repeatedly transmitting an updated version of code book information from the first node to the second node;
  creating the code book; assigning a code word to at least one resource unit in a manner so that the control information identified by the assigned code word applies to the resource unit to which the assigned code word is assigned; creating resource unit usage information comprising at least one assigned code word, the resource unit usage information being indicative of at least one resource unit to which the assigned code word has been assigned; wherein an order of appearance of the assigned code word with respect to other assigned code words in the resource unit usage information signifies the at least one resource unit to which the assigned code word applies; sending the code book information to the second node; and sending the resource unit usage information to the second node; wherein the code book is dynamically updated by means of repeatedly performing the steps of creating a code book and sending code book information; and
  wherein the control information applicable to a resource unit comprises an identity of a session to which a resource unit should be allocated and a transmission format to be applied to the resource unit, and the code book information comprises a session identity field identifying a session to which at least two resource units should be allocated on which different transmission formats should be used, and wherein the session identity field is associated with the transmission format of the at least two resource units.

8. A first communications node for communicating with a second communications node in a communications system providing a plurality of resource units for the transmission of data, the first node comprising:
  means for transmitting control information to the second node, wherein the means for transmitting control information is adapted to transmitting the control information by use of a code book comprising at least one code identifying control information relating to data transmission over a resource unit; and the means for transmitting is adapted to repeatedly transmitting an updated version of code book information in order to achieve that the code book is dynamic;
  means for creating the code book; means for assigning a code word to at least one resource unit in a manner so that the control information identified by the assigned code word applies to the resource unit to which the assigned code word is assigned; and means for creating resource unit usage information comprising at least one assigned code word, the resource unit usage information being indicative of at least one resource unit to which the assigned code word has been assigned; wherein an order of appearance of the assigned code word with respect to other assigned code words in the resource unit usage information signifies the at least one resource unit to which the assigned code word applies; wherein the means for transmitting comprises means for sending the code book information and the resource unit usage information to the second node; and the means for creating a code book is arranged to repeatedly update the code book, and the means for sending the code book information is arranged to repeatedly send updated code book information, in order to achieve that the code book is dynamic; and
  wherein the control information applicable to a resource unit comprises an identity of a session to which a resource unit should be allocated and a transmission format to be applied to the resource unit, and the code book information comprises a session identity field identifying a session to which at least two resource units should be allocated on which different transmission formats should be used, and wherein the session identity field is associated with the transmission format of the at least two resource units.

9. The first node of claim 8, wherein the first node is radio base station and the second node is a mobile station.

10. The radio base station of claim 9, wherein the radio base station is adapted to serve a plurality of mobile stations within a cell, and the means for transmitting is adapted to sending the code book information on a channel to which all mobile stations within the cell can listen simultaneously.

11. The radio base station of claim 9, wherein the radio base station is arranged to receive quality measurements of a radio connection between the radio base station and the mobile station; and the means for creating the code book is arranged to create the code book in accordance with the quality measurements, in a manner so that the gain achieved by creating the code book is greater than the cost of transmitting the code book information and the resource unit usage information.

12. A mobile radio communication system for providing a plurality of resource units for the transmission of data, the mobile radio communication system comprising:
  a first communications node for communicating with a second communications node, the first node comprising:
  means for transmitting control information to the second node, wherein the means for transmitting control information is adapted to transmitting the control information by use of a code book comprising at least one code identifying control information relating to data transmission over a resource unit; and the means for transmitting is adapted to repeatedly transmitting an updated version of code book information in order to achieve that the code book is dynamic;
  means for creating the code book; means for assigning a code word to at least one resource unit in a manner so that the control information identified by the assigned code word applies to the resource unit to which the assigned code word is assigned; and means for creating resource unit usage information comprising at least one assigned code word, the resource unit usage information being indicative of at least one resource unit to which the assigned code word has been assigned; wherein an order of appearance of the assigned code word with respect to other assigned code words in the resource unit usage information signifies the at least one resource unit to which the assigned code word applies; wherein the means for transmitting comprises means for sending the code book information and the resource unit usage information to the second node; and the means for creating a code book is arranged to repeatedly update the code book, and the means for sending the code book information is arranged to repeatedly send updated code book information, in order to achieve that the code book is dynamic; and wherein the control information applicable to a resource unit comprises an identity of a session to which a resource unit should be allocated and a transmission format to be applied to the resource unit, and the code book information comprises a session identity field identifying a session to which at least two resource units should be allocated on which different transmission formats should be used, and wherein the session identity field is associated with the transmission format of the at least two resource units.

13. A first communications node for communicating with a second communications node in a communications system providing a plurality of resource units for the transmission of data, the first node comprising:

a computer that runs a computer code on a computer program product to execute following:

transmitting control information to the second node, wherein the transmitting operation is adapted to transmitting the control information by use of a code book comprising at least one code identifying control information relating to data transmission over a resource unit; and the transmitting operation is adapted to repeatedly transmit an updated version of code book information in order to achieve that the code book is dynamic;

creating the code book; assigning a code word to at least one resource unit in a manner so that the control information identified by the assigned code word applies to the resource unit to which the assigned code word is assigned; and creating resource unit usage information comprising at least one assigned code word, the resource unit usage information being indicative of at least one resource unit to which the assigned code word has been assigned; wherein an order of appearance of the assigned code word with respect to other assigned code words in the resource unit usage information signifies the at least one resource unit to which the assigned code word applies; wherein the transmitting operation comprises sending the code book information and the resource unit usage information to the second node; and the code book creating operation is arranged to repeatedly update the code book, and the sending operation for sending the code book information is arranged to repeatedly send updated code book information, in order to achieve that the code book is dynamic; and wherein the control information applicable to a resource unit comprises an identity of a session to which a resource unit should be allocated and a transmission format to be applied to the resource unit, and the code book information comprises a session identity field identifying a session to which at least two resource units should be allocated on which different transmission formats should be used, and wherein the session identity field is associated with the transmission format of the at least two resource units.

* * * * *